United States Patent
Park

(10) Patent No.: US 7,972,891 B2
(45) Date of Patent: Jul. 5, 2011

(54) IMAGE SENSOR AND METHOD FOR MANUFACTURING THE SAME

(75) Inventor: Jin-Ho Park, Yeongju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 251 days.

(21) Appl. No.: 12/252,461

(22) Filed: Oct. 16, 2008

(65) Prior Publication Data
US 2009/0101952 A1    Apr. 23, 2009

(30) Foreign Application Priority Data
Oct. 22, 2007    (KR) .................. 10-2007-0105940

(51) Int. Cl.
*H01L 31/0232*    (2006.01)

(52) U.S. Cl. ................... 438/72; 257/E31.127

(58) Field of Classification Search .............. 438/72, 438/FOR. 136; 257/E31.127
See application file for complete search history.

(56) References Cited

U.S. PATENT DOCUMENTS

| | | | |
|---|---|---|---|
| 6,362,498 B2 * | 3/2002 | Abramovich | 257/233 |
| 7,262,072 B2 * | 8/2007 | Kim | 438/57 |
| 7,368,779 B2 * | 5/2008 | Liu et al. | 257/306 |
| 2006/0012001 A1 | 1/2006 | Kim | |
| 2006/0138412 A1 * | 6/2006 | Park | 257/53 |
| 2006/0255417 A1 | 11/2006 | Kang | |

FOREIGN PATENT DOCUMENTS

| | | | |
|---|---|---|---|
| CN | 1862823 | | 11/2006 |
| JP | 2006196626 A | * | 7/2006 |
| KR | 10-2004-0008925 | | 1/2004 |
| KR | 10-2007-0087858 | | 8/2007 |

* cited by examiner

*Primary Examiner* — George Fourson
(74) *Attorney, Agent, or Firm* — Sherr & Vaughn, PLLC

(57) ABSTRACT

An image sensor and a method for manufacturing the same that includes photodiodes formed in a semiconductor substrate, a first insulating layer formed over the semiconductor substrate, the first insulating layer including a seed pattern corresponding spatially to the positions of the photodiodes, lower microlenses composed of an organic material formed over the seed pattern, a second insulating layer formed over the lower microlenses, a third insulating layer formed over the second insulating layer, color filters formed over the third insulating layer, and upper micro lenses formed over the color filters.

9 Claims, 2 Drawing Sheets

IMAGE SENSOR AND METHOD FOR MANUFACTURING THE SAME

Figure 1:
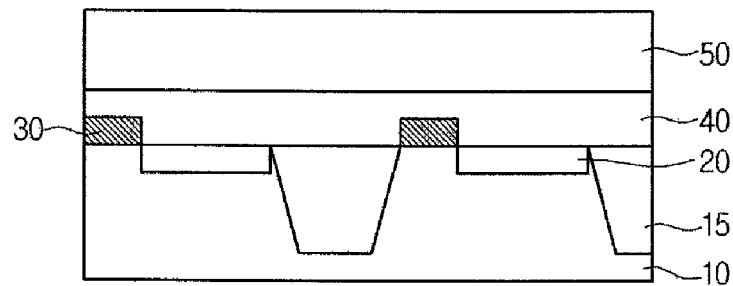

The present application claims priority under 35 U.S.C. §119 to Korean Patent Application No. 2007-0105940 (filed on Oct. 22, 2007), which is hereby incorporated by reference in its entirety.

BACKGROUND

Image sensors are semiconductor devices which convert an optical image into an electrical signal. Image sensors may be classified as a change coupled device (CCD) image sensor and a complementary metal oxide silicon (CMOS) image sensor (CIS). A CMOS image sensor includes a photodiode and a MOS transistor in each of unit pixels, and thus, sequentially detects electrical signals of the respective unit pixels in a switching mode, thereby displaying an image. As a design rule in the CMOS image sensor has been gradually decreased, the size of the unit pixels is decreased, and thus, a fill factor may be decreased.

SUMMARY

Embodiments relate to an image sensor and a method for manufacturing the image sensor which employs double micro lenses for maximizing a fill factor.

Embodiments relate to an image sensor that may include at least one of the following: photodiodes formed in a semiconductor substrate, the photodiodes respectively provided in unit pixels; a first insulating layer provided on and/or over the semiconductor substrate, the first insulating layer including a seed pattern corresponding spatially to the positions of the photo diodes; first micro lenses formed on and/or over the seed pattern including by coating the first insulating layer with an organic material; a second insulating layer provided on and/or over the organic material including the first micro lenses; and filters and second micro lenses sequentially provided on and/or over the second insulating layer.

Embodiments relate to an image sensor that may include at least one of the following: photodiodes formed in a semiconductor substrate; a first insulating layer formed over the semiconductor substrate, the first insulating layer including a seed pattern corresponding spatially to the positions of the photodiodes; lower microlenses composed of an organic material formed over the seed pattern; a second insulating layer formed over the lower microlenses; a third insulating layer formed over the second insulating layer; color filters formed over the third insulating layer; and upper micro lenses formed over the color filters.

Embodiments relate to a method for manufacturing an image sensor that may include at least one of the following: forming photodiodes in a semiconductor substrate, the photodiodes being respectively provided in unit pixels; and then forming a first insulating layer on and/or over the semiconductor substrate; and then forming a seed pattern on and/or over the insulating layer corresponding spatially to the positions of the photo diodes by partially etching the first insulating layer; and then forming first micro lenses covering the seed pattern; and then forming a second insulating layer on and/or over the entire surface of the semiconductor substrate including the first micro lenses; and then forming filters and second micro lenses sequentially on and/or over the second insulating layer.

Embodiments relate to a method for manufacturing an image sensor that may include at least one of the following: forming photodiodes in a semiconductor substrate; and then forming a first insulating layer over the semiconductor substrate; and then forming first insulating layer seed patterns corresponding spatially to the positions of the photodiodes by partially etching the first insulating layer; and then forming lower micro lenses over the seed patterns; and then sequentially forming a second insulating layer and a third insulating layer over the lower microlenses; and then forming color filters formed over the third insulating layer corresponding spatially to the lower microlenses; and then forming upper micro lenses over the color filters and corresponding spatially to the positions of the color filters.

Embodiments relate to a method for manufacturing an image sensor that may include at least one of the following: forming isolation layers defining active regions and field regions in a semiconductor substrate; and then forming photodiodes in the semiconductor substrate; and then forming transistors electrically connected to the photodiodes over the semiconductor substrate; and then forming a pre-metal dielectric layer over the entire semiconductor substrate including the photodiodes, the transistors and the isolation layers; and then forming a first insulating layer over the pre-metal dielectric layer; and then forming first insulating layer seed patterns corresponding spatially to the photodiodes; and then forming lower microlenses by forming an organic layer over the seed patterns; and then sequentially forming a second insulating layer and a third insulating layer over the lower microlenses; and then forming color filters formed over the third insulating layer corresponding spatially to the lower microlenses; and then forming upper micro lenses over the color filters and corresponding spatially to the positions of the color filters.

DRAWINGS

Example FIGS. 1 to 6 illustrate a method for manufacturing an image sensor in accordance with embodiments.

DESCRIPTION

Hereinafter, an image sensor and a method for manufacturing the same in accordance with embodiments will be described in detail with reference to the accompanying example drawing figures. In the example drawing figures, the thicknesses or sizes of respective layers will be magnified, omitted, or schematically illustrated for the convenience or clearness of illustration. The sizes of respective elements do not represent the real sizes of the elements.

As illustrated in example FIG. 1, an image sensor in accordance with embodiments can include forming isolation layer 15 defining active regions and field regions isolated in semiconductor substrate 10. Photodiodes 20 for receiving light to generate photoelectrons are then formed in semiconductor substrate 10. CMOS circuits 30 electrically connected to photodiodes 20 to convert the received photoelectrons to an electric signal are then formed on and/or over the active regions of unit pixels of semiconductor substrate 10. PMD layer 40 is then formed on and/or over semiconductor substrate 10 including photodiodes 20 and CMOS circuits 30. PMD layer 40 includes metal lines and contact plugs electrically connecting the metal lines. First insulating layer 50 is then formed on and/or over PMD layer 40. First insulating layer 50 may be made of an oxide film or a nitride film. For example, first insulating layer 50 is made of an undoped silicate glass (USG) film. First insulating layer 50 may include metal lines, and further include contact plugs electrically connecting the metal lines. The metal lines and the contact plugs of first insulating layer 50, are formed so as to not shield light incident upon photo diodes 20. Meaning, the metal lines and the contact plugs may be formed around regions of first insulating layer 50 guiding incident light.

Figure 2:
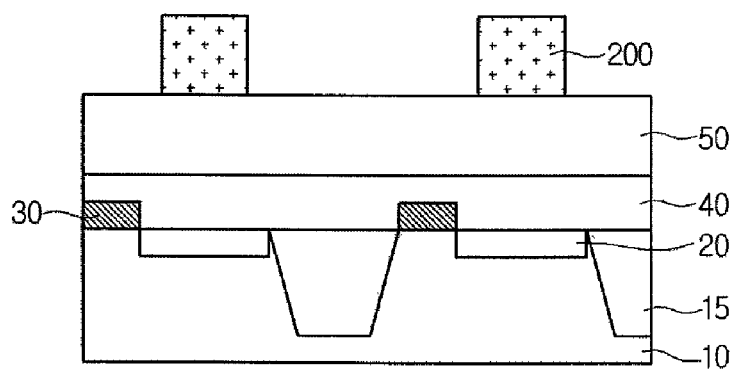

As illustrated in example FIG. 2, photoresist pattern 200 is then formed on and/or over first insulating layer 50 by coating the uppermost surface of first insulating layer 50 with a photoresist film and then exposing and developing the photoresist film. Photoresist pattern 200 is formed in regions corresponding spatially to the positions of photodiodes 20. Meaning, photoresist pattern 200 covers regions where photodiodes 20 are formed and exposes the remaining regions.

Figure 3:
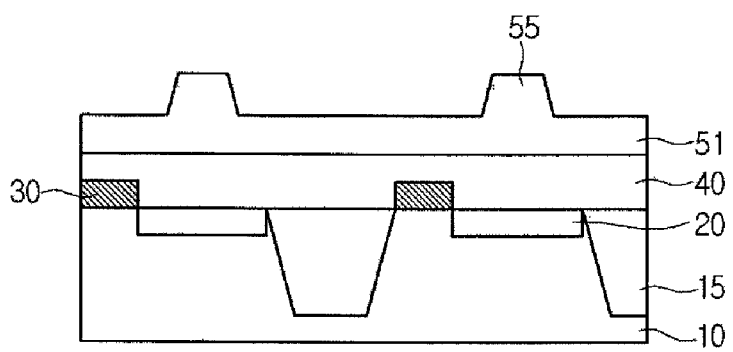

As illustrated in example FIG. 3, seed pattern 55 is then formed on and/or over first insulating layer 50 in the unit pixels by partially etching first insulating layer 50 to a predetermined depth using photoresist pattern 200 as an etching mask. Thereby, a portion of first insulating layer 50 is removed to the predetermined depth in remaining regions except for the regions covered by photoresist pattern 200. Therefore, first insulating pattern 51 including seed pattern 55 is formed. Seed pattern 55 corresponds spatially to the positions of photodiodes 20 respectively formed in the unit pixels. Seed pattern 55 is formed having a rectangular or trapezoidal cross-section by adjusting the etching selectivity of photoresist pattern 200 when first insulating layer 50 is etched.

Figure 4:
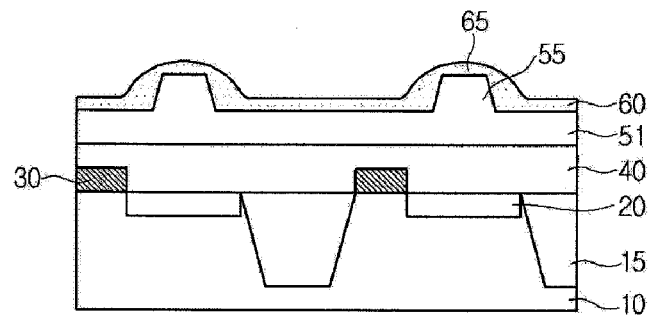

As illustrated in example FIG. 4, the uppermost surface of first insulating pattern 51 including seed pattern 55 is then coated with an organic material such as a thermosetting resin. By coating the uppermost surface of first insulating pattern 51 with the organic material, organic material layer 60 is formed having a portion corresponding to the cross-section of seed pattern 55. Thereby, the portion organic material layer 60 corresponding to the cross-section of seed pattern 55 forms first micro lenses 65 on and/or over seed pattern 55. Since seed pattern 55 is formed having a rectangular or trapezoidal cross-section, first micro lenses 65 formed on and/or over seed pattern 55 may be formed having a hemispherical cross-section. First micro lenses 65 are formed corresponding spatially to the positions of photodiodes 20, thereby maximizing a fill factor. Meaning, since first micro lenses 65 are formed adjacent to photodiodes 20, first micro lenses 65 can more effectively concentrate light, and thus, enhance a fill factor, although the area of photo diodes 20 is reduced. Moreover, first micro lenses 65 are formed having a hemispherical cross-section using a self-alignment method, and thus, a light concentration rate is maximized. Meaning, when the upper surface of first insulating pattern 51 including seed pattern 55 is coated with the organic material, the organic material coated on seed pattern 55 is formed having a hemispherical cross-section due to the trapezoidal shape of the underlying seed pattern 55, and thus, the light concentration rate of first micro lenses 65 is enhanced.

Figure 5:
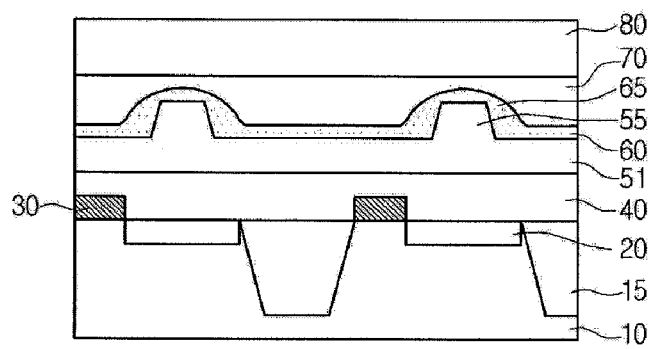

As illustrated in example FIG. 5, after first micro lenses 65 are formed, second insulating layer 70 and third insulating layer 80 are sequentially formed on and/or over organic material layer 60 including first micro lenses 65. Meaning, second insulating film 70 is initially formed on and/or over the entire surface of semiconductor substrate 10 including first micro lenses 65, and then third insulating layer 80 is formed on and/or over second insulating layer 70. Since the uppermost surface of second insulating layer 70 formed on and/or over organic layer 60 including first micro lenses 65 is not uniform (i.e., flat) due to the lower structure, planarization of the uppermost surface of second insulating layer 70 is carried out. Thereafter, third insulating layer 80 is formed on and/or over the planarized uppermost surface of second insulating layer 70. Second insulating layer 70 and third insulating layer 80 are made of an oxide film or a nitride film. Metal lines, which are electrically connected to the metal lines of first insulating layer 50, may be formed in second insulating layer 70 and third insulating layer 80.

Figure 6:
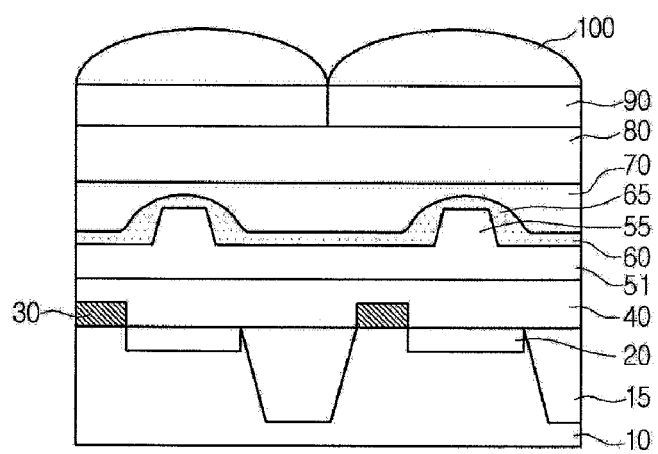

As illustrated in example FIG. 6, color filters 90 and second micro lenses 100 are then sequentially formed on and/or over third insulating layer 80. Color filters 90 are formed through a spin coating process using a color filter material including a photosensitive material and a pigment or a photosensitive material and a dye. Thereafter, the color filter material is exposed using a pattern mask and is developed, thereby producing color filters 90. Color filters 90 are respectively formed corresponding spatially to the positions of photodiodes 20 and serve to separate colors from incident light. For example, each one color filter 90 is one out of red, green, and blue color filters. Second micro lenses 100 are then formed on and/or over color filters 90 by first forming an angled lens pattern corresponding spatially to the unit pixels by applying a photosensitive photoresist made of a silicon oxide film having a high light transmittance. The photosensitive photoresist is then patterned to thereby form second micro lenses 100 having a hemispherical cross-section by carrying out a reflow process of the patterned photosensitive photoresist. Second micro lenses 100, one of which is formed in each of the unit pixels, serve to concentrate light on and/or over photodiodes 20 which are disposed below second micro lenses 100 in semiconductor substrate 10.

Accordingly, as illustrated in example FIG. 6, an image sensor in accordance with embodiments includes device isolation layers 15 formed in semiconductor substrate 10 to define active regions. Photodiodes 20 which receive light to generate photoelectrons, each of which is provided in each of unit pixels, are formed in semiconductor substrate 10. CMOS circuits 30, electrically connected to photodiodes 20 to convert the received photoelectrons to an electric signal, are formed on and/or over semiconductor substrate 10 such that photodiodes 20 and CMOS circuits 30 are respectively provided in each of the unit pixels. Pre-metal dielectric (PMD) layer 40 is provided on and/or over semiconductor substrate 10 including photodiodes 20. First insulating layer pattern 51 including seed patterns 55 is formed on and/or over PMD layer 40. For example, first insulating layer pattern 51 and seed pattern 55 may be composed of an undoped silicate glass (USG) film. Seed pattern 55 may be respectively formed having a trapezoidal cross-section on and/or over regions corresponding spatially to photodiodes 20. Organic material layer 60 is formed on and/or over first insulating layer pattern 51 including seed pattern 55. Organic material layer 60 is composed of a thermosetting resin. A portion of organic material layer 60 formed on and/or over seed pattern 55 may be formed having a hemispherical cross-section due to the protruding (trapezoidal) shape of the underlying seed pattern 55. This portion of organic material layer 60 formed on and/or over seed pattern 55 forms first micro lenses 65. Second insulating layer 70 and third insulating layer 80 are sequentially formed on and/or over first micro lenses 65. Color filters 90 are then formed on and/or over third insulating film 80 to separate colors from incident light. Second micro lenses 100 are respectively provided on and/or over color filters 90 in the unit pixels, and serve to concentrate light to be transmitted to photodiodes 20. In the image sensor in accordance with embodiments, first micro lenses 65 and second micro lenses 100 are respectively formed on and/or over photo diodes 20, thereby maximizing the fill factor of the image sensor.

As apparent from the above description, embodiments provide an image sensor and a method for manufacturing the same in which double (upper and lower) micro lenses are formed on and/or over photo diodes respectively formed in the unit pixels to enhance a fill factor. First or lower micro lenses are formed in the insulating layer formed on and/or over the photo diodes and second or upper micro lenses are formed on and/or over the photo diodes, and thus, light incident upon the image sensor is double concentrated through the first and second micro lenses to enhance the fill factor. Further, the first micro lenses are formed on and/or over a seed pattern having a trapezoidal cross-section, and thus, can be formed having a hemispherical cross-section without any additional process. Therefore, it is possible to enhance the light concentration rate of the photo diodes.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor comprising:
    forming photodiodes in a semiconductor substrate;
    forming a first insulating layer over the semiconductor substrate;
    forming first insulating layer seed patterns corresponding spatially to the positions of the photodiodes by partially etching the first insulating layer;
    forming lower micro lenses over the seed patterns, wherein the lower micro lenses having a hemispheric shape are formed by coating the first insulating layer including the seed patterns with an organic material comprising a thermosetting resin;
    sequentially forming a second insulating layer and a third insulating layer over the lower microlenses;
    forming color filters formed over the third insulating layer corresponding spatially to the lower microlenses; and
    forming upper micro lenses over the color filters and corresponding spatially to the positions of the color filters.

2. The method of claim 1, wherein forming the seed patterns comprises:
    forming a photoresist pattern over regions of the uppermost surface of the first insulating layer corresponding spatially to the positions of the photodiodes; and then
    partially etching the first insulating layer using the photoresist pattern as an etching mask.

3. The method of claim 2, wherein the seed patterns are formed having one of a rectangular cross-section shape and a trapezoidal cross-section.

4. The method of claim 1, wherein the first insulating layer including the seed patterns comprises undoped silicate glass (USG).

5. The method of claim 1, wherein the second insulating layer and the third insulating layer comprise one of an oxide film and a nitride film.

6. A method for manufacturing an image sensor comprising:
    forming isolation layers defining active regions and field regions in a semiconductor substrate;
    forming photodiodes in the semiconductor substrate;
    forming transistors electrically connected to the photodiodes over the semiconductor substrate;
    forming a pre-metal dielectric layer over the entire semiconductor substrate including the photodiodes, the transistors and the isolation layers;
    forming a first insulating layer over the pre-metal dielectric layer;
    forming first insulating layer seed patterns corresponding spatially to the photodiodes;
    forming lower microlenses by forming an organic layer over the seed patterns, wherein the organic layer comprises a thermosetting resin;
    sequentially forming a second insulating layer and a third insulating layer over the lower microlenses;
    forming color filters formed over the third insulating layer corresponding spatially to the lower microlenses; and
    forming upper micro lenses over the color filters and corresponding spatially to the positions of the color filters.

7. The method of claim 6, wherein the transistors comprise CMOS circuits.

8. The method of claim 6, wherein the first insulating layer including the seed patterns comprises undoped silicate glass (USG).

9. The method of claim 6, wherein the seed patterns are formed having one of a rectangular cross-section and a trapezoidal cross-section.

* * * * *